(12) United States Patent
Murata

(10) Patent No.: US 9,299,869 B2
(45) Date of Patent: *Mar. 29, 2016

(54) TEMPERED GLASS SUBSTRATE AND METHOD OF PRODUCING THE SAME

(75) Inventor: Takashi Murata, Otsu (JP)

(73) Assignee: NIPPON ELECTRIC GLASS CO., LTD., Shiga (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/491,731

(22) Filed: Jun. 8, 2012

(65) Prior Publication Data

US 2012/0251827 A1  Oct. 4, 2012

Related U.S. Application Data

(60) Division of application No. 12/320,786, filed on Feb. 4, 2009, which is a continuation-in-part of application No. PCT/JP2008/062941, filed on Jul. 17, 2008.

(30) Foreign Application Priority Data

Aug. 3, 2007  (JP) ................................. 2007-203604
Jun. 13, 2008 (JP) ................................. 2008-154906

(51) Int. Cl.

| | |
|---|---|
| *B32B 17/06* | (2006.01) |
| *C03C 21/00* | (2006.01) |
| *H01L 31/048* | (2014.01) |
| *C03C 3/083* | (2006.01) |
| *C03C 3/087* | (2006.01) |
| *C03C 3/091* | (2006.01) |
| *C03C 3/093* | (2006.01) |
| *C03C 23/00* | (2006.01) |
| *G06F 3/041* | (2006.01) |

(52) U.S. Cl.
CPC ............. *H01L 31/048* (2013.01); *C03C 3/083* (2013.01); *C03C 3/087* (2013.01); *C03C 3/091* (2013.01); *C03C 3/093* (2013.01); *C03C 21/002* (2013.01); *C03C 23/007* (2013.01); *G06F 3/0416* (2013.01); *Y02E 10/50* (2013.01); *Y10T 428/26* (2015.01); *Y10T 428/31* (2015.01); *Y10T 428/315* (2015.01)

(58) Field of Classification Search
CPC ............ C03C 3/00; C03C 3/04; C03C 3/076; C03C 3/083; C03C 3/085; C03C 15/00; C03C 21/00; C03C 21/001; C03C 21/002; C03C 2203/00; C02C 2204/08; B32B 17/00; B32B 17/06; B32B 33/00; B32B 2255/00; B32B 2255/20; B32B 2457/20; B32B 2457/208
USPC ......... 428/409, 410, 689, 702, 426, 428, 432, 428/688, 699, 701; 65/30, 14, 30.14; 501/55, 68, 69, 701, 70
See application file for complete search history.

(56) References Cited

U.S. PATENT DOCUMENTS

| | | | |
|---|---|---|---|
| 4,015,045 A * | 3/1977 | Rinehart ....................... 428/410 |
| 5,674,790 A | 10/1997 | Araujo | |
| 5,776,844 A | 7/1998 | Koch et al. | |
| 5,780,371 A | 7/1998 | Rifqi et al. | |
| 5,846,280 A * | 12/1998 | Speit ............................ 65/30.14 |
| 5,895,768 A | 4/1999 | Speit | |
| 5,900,296 A * | 5/1999 | Hayashi et al. .............. 428/64.1 |
| 5,958,812 A | 9/1999 | Koch et al. | |
| 5,972,460 A | 10/1999 | Tachiwana | |
| 6,413,892 B1 * | 7/2002 | Koyama et al. .................. 501/64 |
| 6,518,211 B1 | 2/2003 | Bradshaw et al. | |
| 7,666,511 B2 | 2/2010 | Ellison et al. | |
| 7,687,420 B2 | 3/2010 | Murata | |
| 2001/0046026 A1 | 11/2001 | Suginoya et al. | |
| 2001/0049327 A1 | 12/2001 | Hachitani | |
| 2002/0142191 A1 | 10/2002 | Sakai et al. | |
| 2003/0061835 A1 | 4/2003 | Yoda et al. | |
| 2003/0109202 A1* | 6/2003 | Matsuno et al. ................ 451/41 |
| 2003/0220183 A1* | 11/2003 | Kurachi et al. ................. 501/70 |
| 2004/0187659 A1 | 9/2004 | Nishiyama | |
| 2005/0003136 A1 | 1/2005 | Kurachi et al. | |
| 2006/0063009 A1 | 3/2006 | Naitou et al. | |
| 2006/0216552 A1 | 9/2006 | Ikenishi et al. | |
| 2008/0020919 A1 | 1/2008 | Murata | |
| 2008/0202298 A1 | 8/2008 | Nishiyama | |
| 2008/0286548 A1* | 11/2008 | Ellison et al. ................. 428/220 |
| 2009/0142568 A1 | 6/2009 | Dejneka et al. | |
| 2009/0143214 A1 | 6/2009 | Niida et al. | |
| 2009/0197048 A1 | 8/2009 | Amin et al. | |
| 2009/0202808 A1 | 8/2009 | Glaesemann et al. | |
| 2009/0215607 A1 | 8/2009 | Dejneka et al. | |
| 2009/0220761 A1 | 9/2009 | Dejneka et al. | |
| 2010/0035745 A1 | 2/2010 | Murata | |
| 2010/0087307 A1 | 4/2010 | Murata et al. | |
| 2010/0119846 A1 | 5/2010 | Sawada | |
| 2011/0014475 A1 | 1/2011 | Murata | |
| 2011/0159322 A1 | 6/2011 | Ikenishi et al. | |
| 2011/0207594 A1 | 8/2011 | Niida et al. | |

FOREIGN PATENT DOCUMENTS

| | | |
|---|---|---|
| CN | 1616364 A | 5/2005 |
| CN | 1705621 A | 12/2005 |

(Continued)

OTHER PUBLICATIONS

JP-2002174810 Hachitani English machine translation.*
Chinese Office Action dated Jun. 25, 2012 in corresponding Chinese Application No. 201110227164.4, with English translation.
Sakka et al., "Strengthening of Glass by Alkali-Copper Ion Exchange", Journal of Non-Crystalline Solids, vol. 37, 1980, pp. 139-141.

(Continued)

*Primary Examiner* — David Sample
*Assistant Examiner* — Lauren Colgan
(74) *Attorney, Agent, or Firm* — Wenderoth, Lind & Ponack, L.L.P.

(57) ABSTRACT

A tempered glass substrate of the present invention is a tempered glass substrate, which has a compression stress layer on a surface thereof, and has a glass composition comprising, in terms of mass %, 40 to 71% of $SiO_2$, 3 to 21% of $Al_2O_3$, 0 to 3.5% of $Li_2O$, 7 to 20% of $Na_2O$, and 0 to 15% of $K_2O$.

20 Claims, No Drawings

(56) References Cited

FOREIGN PATENT DOCUMENTS

| | | |
|---|---|---|
| DE | 196 16 633 | 5/1997 |
| DE | 101 41 666 | 3/2003 |
| JP | 57-129839 | 8/1982 |
| JP | 58-185451 | 10/1983 |
| JP | 62-270439 | 11/1987 |
| JP | 1-201043 | 8/1989 |
| JP | 3-237036 | 10/1991 |
| JP | 9-236792 | 9/1997 |
| JP | 10-001329 | 1/1998 |
| JP | 10-67537 | 3/1998 |
| JP | 10-72238 | 3/1998 |
| JP | 10-198942 | 7/1998 |
| JP | 11-191212 | 7/1999 |
| JP | 11-232627 | 8/1999 |
| JP | 2000-159538 | 6/2000 |
| JP | 2001-076336 | 3/2001 |
| JP | 2001-226137 | 8/2001 |
| JP | 2001-348245 | 12/2001 |
| JP | 2002-174810 * | 6/2002 |
| JP | 2002-334658 | 11/2002 |
| JP | 2003-36522 | 2/2003 |
| JP | 2003-171131 | 6/2003 |
| JP | 2004-43295 | 2/2004 |
| JP | 2004-131314 | 4/2004 |
| JP | 2004-352535 | 12/2004 |
| JP | 2005-15328 | 1/2005 |
| JP | 2006-062929 | 3/2006 |
| JP | 2006-83045 | 3/2006 |
| JP | 2006-106195 | 4/2006 |
| JP | 2006-137631 | 6/2006 |
| JP | 2006-179180 | 7/2006 |
| JP | 2006-182644 | 7/2006 |
| JP | 2006-225215 | 8/2006 |
| JP | 2007-31211 | 2/2007 |
| JP | 2007-099557 | 4/2007 |
| JP | 2007-164901 | 6/2007 |
| TW | 2007-12024 | 4/2007 |
| WO | 2004/106253 | 12/2004 |
| WO | 2007/086441 | 8/2007 |
| WO | 2007/138986 | 12/2007 |
| WO | 2008/044694 | 4/2008 |
| WO | 2008/108332 | 9/2008 |
| WO | 2008/143999 | 11/2008 |
| WO | 2008/149858 | 12/2008 |
| WO | 2009/041348 | 4/2009 |
| WO | 2009/108339 | 9/2009 |

OTHER PUBLICATIONS

Sakka et al., "Incorporation of Copper into Glass by the Cu—Na Ion Exchange", Journal of Non-Crystalline Solids, vol. 52, 1982, pp. 77-90.
Wissman et al., "Properties of Chemically Strengthened Glasses", The Soviet Journal of Glass Physics and Chemistry, Russian Original, vol. 6, No. 4, Jul.-Aug. 1980, pp. 285-291 (English translation).
International Search Report issued Aug. 7, 2008 in International (PCT) Application No. PCT/JP2008/062941.
Tetsuro Izumitani et al., "New glass and physicality thereof", First edition, Management System Laboratory Co., Ltd., Aug. 20, 1984, pp. 451-498 with partial translation.
International Preliminary Report on Patentability and Written Opinion of the International Searching Authority mailed Mar. 4, 2010 in International (PCT) Application No. PCT/JP2008/062941.
D.J. Morris et al., "Indentation crack initiation in ion-exchanged aluminosilicate glass", Journal of Materials Science, vol. 39, pp. 2399-2410, (2004).
Supplementary European Search Report dated Jun. 11, 2012 in corresponding European Application No. 08 79 1295.
European Search Report dated Jun. 11, 2012 in corresponding European Application No. 11 18 9113.
European Search Report dated Jun. 11, 2012 in corresponding European Application No. 11 18 9114.
European Search Report dated Jun. 11, 2012 in corresponding European Application No. 12 15 7464.
European Search Report dated Jun. 11, 2012 in corresponding European Application no. 12 15 9486.
Taiwanese Office Action issued Oct. 14, 2013 in corresponding Taiwanese Application No. 097128119.
Taiwanese Office Action issued Apr. 3, 2014 in corresponding Taiwanese Application No. 101120515.
Chinese Office Action issued Sep. 25, 2014 in corresponding Chinese Patent Application No. 201110226927.3 with English translation.
Taiwanese Office Action issued Apr. 27, 2015 in corresponding Application No. 103101464 with partial English translation.

* cited by examiner

TEMPERED GLASS SUBSTRATE AND METHOD OF PRODUCING THE SAME

CROSS-REFERENCE TO RELATED APPLICATION

This is a divisional application of U.S. application Ser. No. 12/320,786 filed Feb. 4, 2009, now pending, which is a continuation-in-part application of international application PCT/JP2008/062941 filed Jul. 17, 2008, and claiming the priorities of Japanese applications 2007-203604 filed Aug. 3, 2007 and 2008-154906 filed Jun. 13, 2008.

TECHNICAL FIELD

The present invention relates to a tempered glass substrate, and particularly, to a tempered glass substrate suitable for cellular phones, digital cameras, personal digital assistance (PDA), solar battery cover glass, or touch panel display substrates.

BACKGROUND ART

Devices such as cellular phones, digital cameras, PDA, solar batteries, or touch panel displays are widely used, and show a tendency of further prevalence.

Conventionally, for those applications, resin substrates made of acryl and the like are used as a protective member for protecting a display. However, the acrylic resin substrate easily bends, because of its low Young's modulus, when the screen of a display is pushed by a pen, human finger and the like, thus, the resin substrate comes into touch with an internal display to generate poor display, in some cases. There is also a problem in that flaw is easily formed on the surface of the acrylic resin substrate, and visibility tends to deteriorate. One method for solving those problems is to use a glass substrate as a protective member. The glass substrate (cover glass) to be used as the protective member is required (1) to have high mechanical strength, (2) to be low in density and light in weight, (3) to be cheap and to be supplied in a large amount, (4) to have excellent bubble quality, (5) to have high optical transmittance in the visible region, and (6) to have high Young's modulus to prevent bending in pushing the surface with a pen, finger, and the like. In particular, when the requirement (1) is not satisfied, a role as the protective member is not attained, thus, glass substrates tempered by ion exchange and the like (so-called tempered glass substrate) are conventionally used (see Patent Document 1, Non-patent Document 1).
Patent Document 1: JP 2006-83045 A
Non-patent Document 1: Tetsuro Izumitani et al., "New glass and physicality thereof", First edition, Management System Laboratory. Co., Ltd., 20 Aug. 1984, p 451-498

DISCLOSURE OF THE INVENTION

Problems to be Solved by the Invention

Non-patent document 1 describes that when the content of $Al_2O_3$ in the glass composition is increased, the ion exchange performance of the glass increases and the mechanical strength of the glass substrate can be improved.

However, when the content of $Al_2O_3$ in the glass composition is further increased, the devitrification resistance of the glass deteriorates, the glass tends to be devitrified in forming, and the production efficiency, quality, and the like of the glass substrate becomes worse. When the devitrification resistance of the glass is poor, forming is only possible by a method such as roll molding, and a glass plate having high surface precision cannot be obtained. Therefore, after forming of the glass plate, a polishing process should be additionally performed separately. When the glass substrate is polished, however, small defects tend to be generated on the surface of the glass substrate, and it becomes difficult to maintain the mechanical strength of the glass substrate.

In view of the above circumstances, it is difficult to attain the ion exchange performance and the devitrification resistance of a glass simultaneously, and it is difficult to remarkably improve the mechanical strength of the glass substrate. For reducing the weight of a device, glass substrates used in devices such as touch panel displays are reduced in thickness year by year. Because a glass substrate with small thickness is easily broken, technologies for improving the mechanical strength of the glass substrate are becoming more important.

Thus, it is a technical object of the present invention to obtain a glass substrate having high mechanical strength by satisfying the ion exchange performance and the devitrification resistance of a glass simultaneously.

Means for Solving the Problems

The inventors of the present invention have conducted various studies and resultantly found that, by setting an $Al_2O_3$ content and a $Na_2O$ content in a glass inappropriate ranges, high ion exchange performance and meltability can be ensured. Also, it has been found that inclusion of $SnO_2$ generates an effect of improving an ion exchange performance while improving the bubble quality of a glass, and in addition, that inclusion of $ZrO_2$ provides the glass with a higher ion exchange performance without deteriorating devitrification, and thus, leading to the proposal of the present invention.

That is, the tempered glass substrate of the present invention has a compression stress layer on a surface thereof, and has a glass composition including, in terms of mass %, 40 to 71% of $SiO_2$, 3 to 21% of $Al_2O_3$, 0 to 3.5% of $Li_2O$, 7 to 20% of $Na_2O$, and 0 to 15% of $K_2O$. Note that, unless otherwise mentioned, "%" means "mass %" in the following descriptions.

Further, the tempered glass substrate of the present invention has a compression stress layer on a surface thereof, and has a glass composition including, in terms of mass %, 40 to 71% of $SiO_2$, 7.5 to 21% of $Al_2O_3$, 0 to 2% of $Li_2O$, 10 to 19% of $Na_2O$, 0 to 15% of $K_2O$, 0 to 6% of $MgO$, 0 to 6% of $CaO$, 0 to 3% of $SrO$, 0 to 3% of $BaO$, and 0 to 8% of $ZnO$.

Further, the tempered glass substrate of the present invention has a compression stress layer on a surface thereof, and has a glass composition including, in terms of mass %, 40 to 71% of $SiO_2$, 8.5 to 21% of $Al_2O_3$, 0 to 1% of $Li_2O$, 10 to 19% of $Na_2O$, 0 to 10% of $K_2O$, 0 to 6% of $MgO$, 0 to 6% of $CaO$, 0 to 3% of $SrO$, 0 to 3% of $BaO$, and 0 to 8% of $ZnO$.

Further, the tempered glass substrate of the present invention includes 0.01 to 3% of $SnO_2$.

Further, the tempered glass substrate of the present invention includes 0.001 to 10% of $ZrO_2$.

Further, the tempered glass substrate of the present invention is formed by being chemically tempered.

Further, in the tempered glass substrate of the present invention, a compression stress of the surface is 300 MPa or more, a depth of the compression stress layer is 10 μm or more, and a internal tensile stress in the glass substrate is 200 MPa or less. Here, "compression stress of surface" and "depth of compression stress layer" are calculated from the number of interference stripes and clearance thereof obtained in observing a sample using a surface stress meter (FSM-6000 manufactured by Toshiba Corporation). The internal tensile stress in the glass substrate is calculated by the following formula.

Internal tensile stress in glass substrate=(compression stress value×stress layer depth)/(plate thickness−stress layer depth×2)

Further, the tempered glass substrate of the present invention has an unpolished surface. Here, "unpolished surface" means that both surfaces (so-called front surface and rear surface) of a glass substrate are not polished. In other words, it means that both surfaces are fire polishing surfaces, and by this, it becomes possible to decrease the average surface roughness (Ra). The average surface roughness (Ra) is measured by a method according to SEMI D7-97 "Measurement method of surface roughness of FPD glass substrate", and should be 10 Å or less, preferably 5 Å or less, and more preferably 2 Å or less. Note that an end surface of the glass substrate may be subjected to a polishing treatment or an etching treatment such as chamfering.

The tempered glass substrate of the present invention has a liquidus temperature of 1200° C. or lower. Here, a glass is ground, and a glass powder passing through a standard sieve of 30 mesh (mesh opening 500 μm) and remaining on 50 mesh (mesh opening 300 μm) is placed in a platinum boat, kept in a temperature gradient furnace for 24 hours, then, the crystal thereof deposits, and the temperature at this stage is referred to as "liquidus temperature".

The tempered glass substrate of the present invention has a liquidus viscosity of $10^{4.0}$ dPa·s or more. Here, "liquidus viscosity" denote the viscosity of a glass at the liquidus temperature. When the liquidus viscosity is higher and the liquidus temperature is lower, the devitrification resistance of a glass is improved, and forming of a glass substrate becomes easy.

Further, the tempered glass substrate of the present invention is used as a cover glass of a display.

Further, the tempered glass substrate of the present invention is used as a cover glass of a solar battery.

Further, the glass substrate of the present invention includes, in terms of mass %, 40 to 71% of $SiO_2$, 3 to 21% of $Al_2O_3$, 0 to 3.5% of $Li_2O$, 7 to 20% of $Na_2O$, and 0 to 15% of $K_2O$.

Further, the glass substrate of the present invention includes, in terms of mass %, 40 to 71% of $SiO_2$, 7.5 to 21% of $Al_2O_3$, 0 to 2% of $Li_2O$, 10 to 19% of $Na_2O$, 0 to 15% of $K_2O$, 0 to 6% of MgO, 0 to 6% of CaO, 0 to 3% of SrO, 0 to 3% of BaO, 0 to 8% of ZnO, and 0.01 to 3% of $SnO_2$.

Further, the glass substrate of the present invention includes, in terms of mass %, 40 to 71% of $SiO_2$, 8.5 to 21% of $Al_2O_3$, 0 to 1% of $Li_2O$, 10 to 19% of $Na_2O$, 0 to 10% of $K_2O$, 0 to 6% of MgO, 0 to 6% of CaO, 0 to 3% of SrO, 0 to 3% of BaO, 0 to 8% of ZnO, 0.01 to 3% of $SfO_2$, and 0.001 to 10% of $ZrO_2$.

Further, a method of producing a tempered glass substrate of the present invention includes: melting a glass raw material which is prepared to have a glass composition including, in terms of mass %, 40 to 71% of $SiO_2$, 3 to 21% of $Al_2O_3$, 0 to 3.5% of $Li_2O$, 7 to 20% of $Na_2O$, and 0 to 15% of $K_2O$; forming the resultant into a plate shape; and performing an ion exchange treatment to form a compression stress layer on a surface of the glass.

Further, in the method of producing a tempered glass substrate of the present invention, the forming the resultant into a plate shape is performed by a down draw method.

Further, in the method of producing a tempered glass substrate of the present invention, the forming the resultant into a plate shape is performed by an overflow down draw method.

Effect of the Invention

The tempered glass substrate of the present invention is manufactured by using glass showing high ion exchange performance. The tempered glass substrate is manufactured using a glass excellent in devitrification resistance, and hence, it is possible to obtain a glass substrate having small surface roughness by adopting an overflow down draw method or the like. Therefore, polishing after forming is unnecessary, and small defects occurred by polishing are not present. As a result, mechanical strength is high, and there is no increase in production cost by polishing, and inexpensive production is possible.

The tempered glass substrate of the present invention is suitable as a cover glass and a touch panel display substrate for cellular phones, digital cameras, PDA, and solar batteries. Note that a touch panel display is mounted on cellular phones, digital cameras, PDA, and the like, and a touch panel display for mobile application is required to attain weight reduction, thickness reduction, and tempering, therefore, there is required, a glass substrate of thin type having high mechanical strength. In this point, the tempered glass substrate of the present invention is suitable for mobile application, because if the plate thickness thereof is reduced, the substrate has practically sufficient mechanical strength.

The glass of the present invention can be formed by an overflow down draw method and the like, because the glass has excellent devitrification resistance. Therefore, when the glass of the present invention is used, a glass substrate having small surface roughness and high mechanical strength can be produced at low cost.

Because the method of producing a tempered glass of the present invention uses a glass having high ion exchange performance and excellent devitrification resistance, a tempered glass substrate having high mechanical strength can be manufactured at low cost.

BEST MODE FOR CARRYING OUT THE INVENTION

The tempered glass substrate of the present invention has a compression stress layer on a surface thereof. The method of forming the compression stress layer on the surface of a glass substrate includes a physical tempering method and a chemical tempering method. For the tempered glass substrate of the present invention, a compression stress layer is formed preferably by a chemical tempering method. The chemical tempering method is a method of introducing alkali ions having large ion radius onto the surface of a glass substrate by ion exchange at a temperature lower than a strain point of the glass. When a compression stress layer is formed by the chemical tempering method, the tempering treatment can be performed successfully even if the plate thickness of the glass substrate is small, and desired mechanical strength can be obtained. Further, even if the glass substrate is cut after the formation of a compression stress layer on the glass substrate, it is not broken easily like a glass substrate tempered by a physical tempering method such as an air cooling tempering method.

The conditions for ion exchange are not particularly limited, and may be determined in view of the viscosity property and the like of a glass. In particular, it is preferred that a K ion in a $KNO_3$ molten salt be ion-exchanged for a Na component in a glass substrate, because a compression stress layer can be formed efficiently on the surface of the glass substrate.

The reason for limiting the glass composition to the above-mentioned range in the tempered glass substrate of the present invention is illustrated below.

$SiO_2$ is a component forming a network of a glass, and content thereof is 40 to 71%, preferably 40 to 70%, 40 to 63%, 45 to 63%, or 50 to 59%, and particularly preferably 55 to 58.5%. When the content of $SiO_2$ is too large, melting and forming of the glass become difficult, the thermal expansion coefficient becomes too small, and matching of the thermal expansion coefficient with those of peripheral materials becomes difficult. On the other hand, when the content of $SiO_2$ is too small, glass formation becomes difficult. Further, the thermal expansion coefficient of the glass becomes large, and the thermal shock resistance of the glass tends to lower.

$Al_2O_3$ is a component enhancing ion exchange performance. It has also an effect of enhancing the strain point and the Young's modulus of a glass, and the content thereof is 3 to 21%. When the content of $Al_2O_3$ is too large, a devitrified crystal tends to deposit in the glass and forming by an overflow down draw method and the like becomes difficult. Further, the thermal expansion coefficient of the glass becomes too small, and matching of the thermal expansion coefficient with those of peripheral materials becomes difficult, and the high temperature viscosity of the glass rises, and it becomes difficult to melt the glass. When the content of $Al_2O_3$ is too small, there occurs a possibility of no manifestation of a sufficient ion exchange performance. From the above-mentioned viewpoints, it is more preferred that the upper limit of the suitable range of $Al_2O_3$ be 20% or less, 19% or less, 18% or less, 17% or less, or 16.5% or less. It is more preferred that the lower limit thereof be 7.5% or more, 8.5% or more, 9% or more, 10% or more, 12% or more, 13% or more, or 14% or more.

$Li_2O$ is an ion exchange component, and is also a component lowering the high temperature viscosity of a glass to improve the meltability and the formability thereof. Further, $Li_2O$ is a component improving the Young's modulus of the glass. Further, $Li_2O$ has a high effect of enhancing the compression stress value in an alkali metal oxide. However, when the content of $Li_2O$ is too large, the liquidus viscosity lowers and the glass tends to be devitrified. Further, the thermal expansion coefficient of the glass increases too much, and hence, the thermal shock resistance of the glass lowers, and matching of the thermal expansion coefficient with those of peripheral materials becomes difficult. Further, when the low temperature viscosity is lowered too much to cause a possibility that stress relaxation occurs easily, the compression stress values decreases adversely in some cases. Therefore, the content of $Li_2O$ is 0 to 3.5%, further, it is preferably 0 to 2%, 0 to 1%, 0 to 0.5%, or 0 to 0.1%, and substantially no content, namely, suppression to less than 0.01% is most preferable.

$Na_2O$ is an ion exchange component, and is also a component lowering the high temperature viscosity of a glass to improve the meltability and the formability thereof. Further, $Na_2O$ is also a component improving the devitrification resistance of the glass. The content of $Na_2O$ is 7 to 20%, and more suitable content thereof is 10 to 20%, 10 to 19%, 12 to 19%, 12 to 17%, or 13 to 17%, and particularly 14 to 17%. When the content of $Na_2O$ is too large, the thermal expansion coefficient of the glass becomes too large, and hence, the thermal shock resistance of the glass lowers, and matching of the thermal expansion coefficient with those of peripheral materials becomes difficult. Further, there are tendencies that the strain point lowers too much, and a balance of the glass composition is lacking, thereby deteriorating the devitrification resistance of the glass. On the other hand, when the content of $Na_2O$ is small, meltability deteriorates, the thermal expansion coefficient becomes too small, and the ion exchange performance deteriorates.

$K_2O$ has an effect of promoting ion exchange, and shows a high effect of enlarging the depth of a compression stress layer, among alkali metal oxides. Further, $K_2O$ is a component having an effect of lowering high temperature viscosity to enhance the meltability and the formability. $K_2O$ is also a component improving devitrification resistance. The content of $K_2O$ is 0 to 15%. When the content of $K_2O$ is too large, the thermal expansion coefficient of a glass becomes large, the thermal shock resistance of the glass lowers, and matching of the thermal expansion coefficient with those of peripheral materials becomes difficult. Further, there are tendencies that the strain point lowers to much, and a balance of the glass composition is lacking, thereby deteriorating the devitrification resistance of the glass, thus, it is preferred that the upper limit be 12% or less, 10% or less, 8% or less, 6% or less, 5% or less, 4% or less, 3% or less, or 2% or less.

When the total content of alkali metal oxides $R_2O$ (R represents one kind or more selected from Li, Na, and K) is too large, the glass tends to be devitrified, and in addition, the thermal expansion coefficient of the glass becomes too large, and hence, the thermal shock resistance of a glass lowers, and matching of the thermal expansion coefficient with those of peripheral materials becomes difficult. Further, when the total content of the alkali metal oxides $R_2O$ is too large, the strain point of the glass lowers too much, and a high compression stress value is not obtained in some cases. Further, the viscosity around the liquidus temperature lowers, and it becomes difficult to obtain high liquidus viscosity in some cases. Therefore, it is preferred that the total content of $R_2O$ be 22% or less or 20% or less, and particularly 19% or less. On the other hand, when the total content of $R_2O$ is too small, the ion exchange performance and the meltability of the glass deteriorate in some cases. Therefore, it is preferred that the total content of $R_2O$ be 8% or more, 10% or more, or 13% or more, and particularly 15% or more.

It is desirable that the value of $(Na_2O+K_2O)/Al_2O_3$ is set in the range of 0.7 to 2, preferably 0.8 to 1.6, more preferably 0.9 to 1.6, still more preferably 1 to 1.6, and most preferably 1.2 to 1.6. When the value becomes more than 2, there are tendencies that the low temperature viscosity lowers too much and the ion exchange performance lowers, the Young's modulus lowers, and the thermal expansion coefficient becomes large, thereby lowering the thermal shock resistance. Further, a balance of the composition is lacking, and the glass tends to be devitrified. On the other hand, when the content is smaller than 0.7, the meltability and the devitrification resistance tend to deteriorate.

Further, the range of the mass ratio of $K_2O/Na_2O$ is preferably 0 to 2. By changing the mass ratio of $K_2O/Na_2O$, the compression stress value and the depth of the stress layer can be changed. When it is desired to set the compression stress value high, it is preferred that the above-mentioned mass ratio be adjusted to be 0 to 0.5, and particularly 0 to 0.3, or 0 to 0.2. On the other hand, when it is desired to make the stress depth larger and to form deeper stress in a short period of time, it is preferred to adjust the above-mentioned mass ratio to 0.3 to 2, and particularly to 0.5 to 2, 1 to 2, 1.2 to 2, or 1.5 to 2. Here, the reason for setting the upper limit of the above-mentioned mass ratio to 2 is that if the mass ratio is more than 2, the glass composition lacks balance, and the glass tends to be devitrified.

In the tempered glass substrate of the present invention, the glass composition may be constituted only of the above-mentioned basic components. However, other components can also be added in a range not significantly deteriorating the property of the glass.

For example, alkaline earth metal oxides R'O (R' represents one kind or more selected from Mg, Ca, Sr, and Ba) are components which can be added for various purposes. However, when the total content of the alkaline earth metal oxides R'O becomes large, the density and the thermal expansion coefficient of the glass becomes large, and the devitrification resistance deteriorates, and in addition, the ion exchange performance tends to deteriorate. Therefore, the total content of the alkaline earth metal oxides R'O should be preferably 0 to 9.9%, 0 to 8%, 0 to 6%, or 0 to 5%.

MgO is a component which lowers the high temperature viscosity of a glass to enhance the meltability and the formability, or to enhance the strain point and the Young's modulus, and shows a high effect of improving the ion exchange performance, among alkaline earth metal oxides. The content of MgO is 0 to 6%. However, when the content of MgO becomes large, the density and the thermal expansion coefficient of the glass increase, and the glass tends to be devitrified. Therefore, it is preferred that the content thereof be 4% or less, 3% or less, 2% or less, or 1.5% or less.

CaO is a component which lowers the high temperature viscosity of a glass to enhance the meltability and the formability, or to enhance the strain point and the Young's modulus, and shows a high effect of improving the ion exchange performance, among alkaline earth metal oxides. The content of CaO is 0 to 6%. However, when the content of CaO becomes large, the density and the thermal expansion coefficient of a glass increase, and the glass tends to be devitrified, and in addition, the ion exchange performance deteriorates in some cases. Therefore, it is preferred that the content thereof be 4% or less, or 3% or less.

SrO and BaO are components which lower the high temperature viscosity of a glass to enhance the meltability and the formability, or to enhance the strain point and the Young's modulus, and each content thereof is preferably 0 to 3%. When the content of SrO or BaO become large, the ion exchange performance tends to deteriorate. Further, the density and the thermal expansion coefficient of the glass increase, and the glass tends to be devitrified. It is preferred that the content of SrO be 2% or less, 1.5% or less, 1% or less, 0.5% or less, or 0.2% or less, and particularly 0.1% or less. It is preferred that the content of BaO be 2.5% or less, 2% or less, 1% or less, 0.8% or less, 0.5% or less, or 0.2% or less, and particularly 0.1% or less.

ZnO is a component which enhances the ion exchange performance of a glass, and in particular, shows a high effect of enhancing the compression stress value. Further, it is a component having an effect of lowering the high temperature viscosity without lowering the low temperature viscosity of the glass, and the content thereof can be set to 0 to 8%. However, when the content of ZnO becomes large, the glass manifests phase separation, the devitrification property deteriorates, and the density becomes large, thus, it is preferred that the content thereof be 6% or less, or 4% or less, 3% or less, 1% or less, 0.5% or less, and particularly 0.1% or less.

In the present invention, by limiting the total content of SrO+BaO to 0 to 5%, the ion exchange performance can be improved more effectively. That is, because SrO and BaO have an action of blocking the ion exchange reaction as described above, it is disadvantageous to contain a large amount of those components for obtaining a tempered glass having high mechanical strength. The preferable range of SrO+BaO is 0 to 3%, 0 to 2.5%, 0 to 2%, 0 to 1%, or 0 to 0.2%, and particularly 0 to 0.1%.

When the value obtained by dividing the total content of R'O by the total content of $R_2O$ becomes large, a tendency of deteriorating the devitrification resistance of a glass appears. Therefore, it is preferred that the value in terms of mass fraction of R'O/$R_2O$ be regulated to 0.5 or less, 0.4 or less, or 0.3 or less.

Because $SnO_2$ has an effect of improving the ion exchange performance, in particular, the compression stress value, it is preferred that the content of $SnO_2$ be 0.01 to 3%, 0.01 to 1.5%, or 0.1 to 1%. When the content of $SnO_2$ increases, there occurs a tendency that devitrification ascribable to $SnO_2$ is generated, and the glass is easily colored.

$ZrO_2$ has effects of remarkably improving the ion exchange performance and simultaneously, enhancing the Young's modulus and the strain point of a glass, and lowering the high temperature viscosity. Further, $ZrO_2$ has an effect of enhancing the viscosity around the liquidus viscosity of a glass, therefore, by inclusion of a given amount of $ZrO_2$, the ion exchange performance and the liquidus viscosity can be improved simultaneously. However, if the content thereof is too large, the devitrification resistance remarkably deteriorates in some cases. Thus, it is preferred that $ZrO_2$ be contained in an amount of 0.001 to 10%, 0.1 to 9%, 0.5 to 7%, 1 to 5%, or 2.5 to 5%.

$B_2O_3$ is a component having an effect of lowering the liquidus temperature, high temperature viscosity, and density of a glass and having an effect of improving the ion exchange performance of the glass, in particular, the compression stress value. Therefore, $B_2O_3$ can be contained together with the above-mentioned components. When the content of $B_2O_3$ is too large, there are possibilities that weathering occurs on the surface by ion exchange, the water resistance of the glass deteriorates, and the liquidus viscosity lowers. Further, the stress layer depth tends to lower. Therefore, the content of $B_2O_3$ is 0 to 6%, preferably 0 to 4%, and more preferably 0 to 3%.

$TiO_2$ is a component having an effect of improving the ion exchange performance. Further, it has an effect of lowering the high temperature viscosity of a glass. However, when the content thereof becomes too large, the glass is colored, the devitrification property deteriorates, and the density becomes high. Particularly in the case of using the glass as a cover glass of a display, if the content of $TiO_2$ becomes large, the transmittance of the glass tends to change when the melting atmosphere or raw materials are altered. Therefore, in a process of adhering a glass substrate to a device by utilizing light such as an ultraviolet cured resin, ultraviolet irradiation conditions tend to vary and stable production becomes difficult. Therefore, it is preferred that the content thereof be 10% or less, 8% or less, 6% or less, 5% or less, 4% or less, 2% or less, 0.7% or less, 0.5% or less, 0.1% or less, or 0.01% or less.

In the present invention, it is preferred that $ZrO_2$ and $TiO_2$ be contained in the above-mentioned ranges from the standpoint of improving the ion exchange performance, and reagents may be used or impurities contained in raw materials may be used, as a $TiO_2$ source and a $ZrO_2$ source.

It is preferred that the content of $Al_2O_3+ZrO_2$ be defined as described below from the standpoint of simultaneous satisfaction of the devitrification resistance and high ion exchange performance.

When the content of $Al_2O_3+ZrO_2$ is over 12% (preferably 12.001% or more, 13% or more, 15% or more, 17% or more, 18% or more, or 19% or more), the ion exchange performance of a glass can be improved more effectively. When the content of $Al_2O_3+ZrO_2$ becomes too large, the devitrification property remarkably deteriorates, therefore, it is preferred that the content thereof be 28% or less (preferably, 25% or less, 23% or less, 22% or less, or 21% or less).

$P_2O_5$ is a component which enhances the ion exchange performance of a glass, and in particular, shows a high effect of increasing the depth of the compression stress layer, therefore, the content thereof can be set to 0 to 8%. However, when the content of $P_2O_5$ becomes large, the glass manifests phase separation, and the water resistance and the devitrification resistance tend to lower, thus, it is preferred that the content thereof be 5% or less, 4% or less, or 3% or less, and particularly 2% or less.

As the fining agent, one or more materials selected from the group consisting of $As_2O_3$, $Sb_2O_3$, $CeO_2$, F, $SO_3$, and Cl may be contained in an amount of 0.001 to 3%. It is necessary to refrain as much as possible from the use of $As_2O_3$ and $Sb_2O_3$, in terms of consideration to environments, and each content thereof should be limited to less than 0.1%, further less than 0.01%, and substantially no inclusion is desirable. $CeO_2$ is a component lowering the transmittance of a glass, and the content thereof should be limited to less than 0.1% and preferably less than 0.01%. F may lower the low temperature viscosity of a glass, thereby inducing decrease in the compression stress value, thus, the content thereof should be limited to less than 0.1% and preferably less than 0.01%. Therefore, $SO_3$ and Cl are preferable fining agents of the present invention, and one of or both of $SO_3$ and Cl be contained in an amount of preferably 0.001 to 3%, 0.001 to 1%, or 0.01 to 0.5%, and more preferably 0.05 to 0.4%.

Rare earth oxides such as $Nb_2O_5$, Y2O3 and $La_2O_3$ are components enhancing the Young's modulus of a glass. However, the cost of the raw material itself is high, and when the rare earth oxides are contained in a large amount, the devitrification resistance deteriorates. Therefore, it is desirable that the content thereof is limited to 3% or less, 2% or less, 1% or less, or 0.5% or less, and particularly to 0.1% or less.

Note that, in the present invention, transition metal elements causing intense coloration of a glass, such as Co and Ni, are not preferred, because they lower the transmittance of a glass substrate. In particular, in the case of using transition metal elements in a touch panel display, when the content thereof is large, the visibility of a touch panel display is deteriorated. Specifically, it is desirable that the use amount of raw materials or cullet be adjusted so that the content is 0.5% or less or 0.1% or less, and particularly 0.05% or less.

It is necessary to refrain as much as possible from the use of substances such as Pb and Bi in terms of consideration to environments, and the content thereof should be limited to less than 0.1%.

In the tempered glass substrate of the present invention, the suitable content range of each component can be appropriately selected to attain a preferable glass composition range. Specific examples thereof are shown below.

(1) A glass composition including, in terms of mass, 40 to 71% of $SiO_2$, 7.5 to 21% of $Al_2O_3$, 0 to 2% of $Li_2O$, 10 to 19% of $Na_2O$, 0 to 15% of $K_2O$, 0 to 6% of MgO, 0 to 6% of CaO, 0 to 3% of SrO, 0 to 3% of BaO, 0 to 8% of ZnO, and 0.01 to 3% of $SnO_2$.

(2) A glass composition including, in terms of mass, 40 to 71% of $SiO_2$, 7.5 to 21% of $Al_2O_3$, 0 to 2% of $Li_2O$, 10 to 19% of $Na_2O$, 0 to 15% of $K_2O$, 0 to 6% of MgO, 0 to 6% of CaO, 0 to 3% of SrO, 0 to 3% of BaO, 0 to 8% of ZnO, 0.01 to 3% of $SnO_2$, and 0.001 to 10% of $ZrO_2$.

(3) A glass composition including, in terms of mass, 40 to 71% of $SiO_2$, 8.5 to 21% of $Al_2O_3$, 0 to 1% of $Li_2O$, 10 to 19% of $Na_2O$, 0 to 10% of $K_2O$, 0 to 6% of MgO, 0 to 6% of CaO, 0 to 3% of SrO, 0 to 3% of BaO, 0 to 8% of ZnO, and 0.01 to 3% of $SnO_2$.

(4) A glass composition including, in terms of mass, 40 to 71% of $SiO_2$, 8.5 to 21% of $Al_2O_3$, 0 to 1% of $Li_2O$, 10 to 19% of $Na_2O$, 0 to 10% of $K_2O$, 0 to 6% of MgO, 0 to 6% of CaO, 0 to 3% of SrO, 0 to 3% of BaO, 0 to 8% of ZnO, 0.01 to 3% of $SnO_2$, and 0.001 to 10% of $ZrO_2$.

(5) A glass composition including, in terms of mass %, 40 to 71% of $SiO_2$, 9 to 19% of $Al_2O_3$, 0 to 6% of $B_2O_3$, 0 to 2% of $Li_2O$, 10 to 19% of $Na_2O$, 0 to 15% of $K_2O$, 0 to 6% of MgO, 0 to 6% of CaO, 0 to 3% of SrO, 0 to 3% of BaO, 0 to 6% of ZnO, 0.001 to 10% of $ZrO_2$, and 0.1 to 1% of $SnO_2$, which does not substantially include $As_2O_3$ and $Sb_2O_3$.

(6) A glass composition including, in terms of mass %, 40 to 71% of $SiO_2$, 9 to 18% of $Al_2O_3$, 0 to 4% of $B_2O_3$, 0 to 2% of $Li_2O$, 11 to 17% of $Na_2O$, 0 to 6% of $K_2O$, 0 to 6% of MgO, 0 to 6% of CaO, 0 to 3% of SrO, 0 to 3% of BaO, 0 to 6% of ZnO, 0.1 to 1% of $SnO_2$, and 0.001 to 10% of $ZrO_2$, which does not substantially include $As_2O_3$ and $Sb_2O_3$.

(7) A glass composition including, in terms of mass %, 40 to 63% of $SiO_2$, 9 to 17.5% of $Al_2O_3$, 0 to 3% of $B_2O_3$, 0 to 0.1% of $Li_2O$, 10 to 17% of $Na_2O$, 0 to 7% of $K_2O$, 0 to 5% of MgO, 0 to 4% of CaO, 0 to 3% of SrO+BaO, and 0.01 to 2% of $SnO_2$, which does not substantially include $As_2O_3$ and $Sb_2O_3$, and in which the value of $(Na_2O+K_2O)/Al_2O_3$ is 0.9 to 1.6 and $K_2O/Na_2O$ is 0 to 0.4, in terms of mass fraction.

(8) A glass composition including, in terms of mass %, 40 to 71% of $SiO_2$, 3 to 21% of $Al_2O_3$, 0 to 2% of $Li_2O$, 10 to 20% of $Na_2O$, 0 to 9% of $K_2O$, 0 to 5% of MgO, 0 to 0.5% of $TiO_2$, and 0.001 to 3% of $SnO_2$.

(9) A glass composition characterized by including, in terms of mass %, 40 to 71% of $SiO_2$, 8 to 21% of $Al_2O_3$, 0 to 2% of $Li_2O$, 10 to 20% of $Na_2O$, 0 to 9% of $K_2O$, 0 to 5% of MgO, 0 to 0.5% of $TiO_2$, and 0.001 to 3% of $SnO_2$, and not substantially including $As_2O_3$ and $Sb_2O_3$.

(10) A glass composition characterized by including, in terms of mass %, 40 to 65% of $SiO_2$, 8.5 to 21% of $Al_2O_3$, 0 to 1% of $Li_2O$, 10 to 20% of $Na_2O$, 0 to 9% of $K_2O$, 0 to 5% of MgO, 0 to 0.5% of $TiO_2$, and 0.001 to 3% of $SnO_2$, having the value of $(Na_2O+K_2O)/Al_2O_3$ of 0.7 to 2 in terms of mass fraction, and not substantially including $As_2O_3$, $Sb_2O_3$, and F.

(11) A glass composition characterized by including, in terms of mass %, 40 to 65% of $SiO_2$, 8.5 to 21% of $Al_2O_3$, 0 to 1% of $Li_2O$, 10 to 20% of $Na_2O$, 0 to 9% of $K_2O$, 0 to 5% of MgO, 0 to 0.5% of $TiO_2$, 0.01 to 3% of $SnO_2$, and 0 to 8% of MgO+CaO+SrO+BaO, having the value of $(Na_2O+K_2O)/Al_2O_3$ of 0.9 to 1.7 in terms of mass fraction, and not substantially including $As_2O_3$, $Sb_2O_3$, and F.

(12) A glass composition characterized by including, in terms of mass %, 40 to 63% of $SiO_2$, 9 to 19% of $Al_2O_3$, 0 to 3% of $B_2O_3$, 0 to 1% of $Li_2O$, 10 to 20% of $Na_2O$, 0 to 9% of $K_2O$, 0 to 5% of MgO, 0 to 0.1% of $TiO_2$, 0.01 to 3% of $SnO_2$, 0.001 to 10% of $ZrO_2$, and 0 to 8% of MgO+CaO+SrO+BaO, having the value of $(Na_2O+K_2O)/Al_2O_3$ of 1.2 to 1.6 in terms of mass fraction, and not substantially including $As_2O_3$, $Sb_2O_3$, and F.

(13) A glass composition characterized by including, in terms of mass %, 40 to 63% of $SiO_2$, 9 to 17.5% of $Al_2O_3$, 0 to 3% of $B_2O_3$, 0 to 1% of $Li_2O$, 10 to 20% of $Na_2O$, 0 to 9% of $K_2O$, 0 to 5% of MgO, 0 to 0.1% of $TiO_2$, 0.01 to 3% of $SnO_2$, 0.1 to 8% of $ZrO_2$, and 0 to 8% of MgO+CaO+SrO+BaO, having the value of $(Na_2O+K_2O)/Al_2O_3$ of 1.2 to 1.6 in terms of mass fraction, and not substantially including $As_2O_3$, $Sb_2O_3$, and F.

(14) A glass composition characterized by including, in terms of mass %, 40 to 59% of $SiO_2$, 10 to 15% of $Al_2O_3$, 0 to 3% of $B_2O_3$, 0 to 0.1% of $Li_2O$, 10 to 20% of $Na_2O$, 0 to 7% of $K_2O$, 0 to 5% of MgO, 0 to 0.1% of $TiO_2$, 0.01 to 3% of $SnO_2$, 1 to 8% of $ZrO_2$, and 0 to 8% of MgO+CaO+SrO+BaO, having the value of $(Na_2O+K_2O)/Al_2O_3$ of 1.2 to 1.6 in terms of mass fraction, and not substantially including $As_2O_3$, $Sb_2O_3$, and F.

The tempered glass substrate of the present invention has the above-mentioned glass composition and has a compression stress layer on the glass surface. The compression stress of the compression stress layer is 600 MPa or more, preferably 800 MPa or more, more preferably 1000 MPa or more, still more preferably 1,200 MPa or more, and still more preferably 1,300 MPa or more. The larger the compression stress is, the greater the mechanical strength of a glass substrate is. On the other hand, when extremely large compression stress is formed on the surface of the glass substrate, there is a possibility that micro cracks are generated on the substrate surface, which may lead to decrease in the strength of the glass. Because there is a possibility that the tensile stress present in the glass substrate becomes extremely high, the compression stress is preferably set to be 2500 MPa or less. In order to increase the compression stress, it may be advantageous to increase the content of $Al_2O_3$, $TiO_2$, $ZrO_2$, MgO, ZnO, or $SnO_2$, or to decrease the content of SrO or BaO. Alternatively, it may be advantageous to shorten the time necessary for ion exchange, or to decrease the temperature of an ion exchange solution.

It is preferred that the depth of a compression stress layer be 10 μm or more, 15 μm or more, 20 μm or more, or 30 μm or more. The larger the thickness of a compression stress layer is, the more difficult it is that the glass substrate is cracked even if the glass substrate has a deep flaw. On the other hand, it may become difficult to cut the glass substrate, and the internal tensile stress may increase extremely to cause breakage, it is preferred that the thickness of the compression stress layer be 500 μm or less, 100 μm or less, 80 μm or less, or 60 μm or less. In order to increase the thickness of the compression stress layer, it may be advantageous to increase the content of $K_2O$, $P_2O_5$, $TiO_2$, or $ZrO_2$, or to decrease the content of SrO or BaO. Further, it may be advantageous to elongate the time necessary for ion exchange, or to raise the temperature of an ion exchange solution.

The tensile stress in a glass substrate is 200 MPa or less (preferably 150 MPa or less, more preferably 100 MPa or less, and still more preferably 50 MPa or less). The smaller the value is, the less likely it is that the breakage of glass occurs due to a defect in a glass substrate. However, when the value becomes extremely small, the compression stress value on the surface of the glass substrate decreases and the stress depth decreases, thus, it is preferred that the value be 1 MPa or more, 10 MPa or more, or 15 MPa or more.

It is preferred that the tempered glass substrate of the present invention have a plate thickness of 3.0 mm or less, 1.5 mm or less, 0.7 mm or less, or 0.5 mm or less, and particularly 0.3 mm or less. When the plate thickness of the glass substrate is smaller, the weight of the glass substrate can be reduced more. The tempered glass substrate of the present invention has a merit that even if the plate thickness is decreased, the glass substrate is not broken easily. It is advantage to perform forming of a glass by an overflow down draw method, because the thickness reduction and smoothening of the glass can be attained without polishing.

The tempered glass substrate of the present invention preferably has an unpolished surface, and the average surface roughness (Ra) of the unpolished surface is 10 Å or less, preferably 5 Å or less, more preferably 4 Å or less, still more preferably 3 Å or less, and most preferably 2 Å or less. Note that the average surface roughness (Ra) of the surface may be measured by a method according to SEMI D7-97 "Measurement method of surface roughness of FPD glass substrate". The theoretical strength of glass is essentially very high, but breakage often occurs even with a stress which is by far lower than the theoretical strength. This phenomenon occurs because a small defect called Griffith flaw is generated on the surface of a glass substrate after forming of the glass, for example, in a polishing process. Therefore, when the surface of the tempered glass substrate is not polished, the original mechanical strength of the glass substrate is lowered, and the glass substrate is not broken easily. Further, when the surface of the glass substrate is not polished, a polishing process can be omitted in the glass substrate production process, thus, the production cost of the glass substrate can be decreased. In the tempered glass substrate of the present invention, if the both surfaces of a glass substrate are not polished, the glass substrate becomes more difficult to break. In the tempered glass substrate of the present invention, a chamfering process, etching treatment, and the like may be performed on a cut surface of the glass substrate to prevent breakage occurring from the cut surface of a glass substrate. In order to obtain the unpolished surface, it may be advantageous to carry out forming of the glass by an overflow down draw method.

In the tempered glass substrate of the present invention, the liquidus temperature of the glass is preferably 1200° C. or lower, 1050° C. or lower, 1030° C. or lower, 1010° C. or lower, 1000° C. or lower, 950° C. or lower, or 900° C. or lower, and particularly preferably 870° C. or lower. In order to decrease the liquidus temperature, it may be advantageous to increase the content of $Na_2O$, $K_2O$, or $B_2O_3$, or to decrease the content of $Al_2O_3$, $Li_2O$, MgO, ZnO, $TiO_2$, or $ZrO_2$.

In the tempered glass substrate of the present invention, the liquidus viscosity of the glass is preferably $10^{4.0}$ dPa·s or more, $10^{4.3}$ dPa·s or more, $10^{4.5}$ dPa·s or more, $10^{5.0}$ dPa·s or more, $10^{5.4}$ dPa·s or more, $10^{5.8}$ dPa·s or more, $10^{6.0}$ dPa·s or more, or $10^{6.2}$ dPa·s or more. In order to improve liquidus viscosity, it may be advantageous to increase the content of $Na_2O$ or $K_2O$, or to decrease the content of $Al_2O_3$, $Li_2O$, MgO, ZnO, $TiO_2$, or $ZrO_2$.

Note that when the liquidus viscosity is higher and the liquidus temperature is lower, the devitrification resistance of the glass is more excellent and the formability of a glass substrate is more excellent. When the liquidus temperature of a glass is 1200° C. or lower and the liquidus viscosity of the glass is $10^{4.0}$ dPa·s or more, forming is possible by an overflow down draw method.

The tempered glass substrate of the present invention has a glass density of preferably 2.8 g/cm³ or less, more preferably 2.7 g/cm³ or less, and still more preferably 2.6 g/cm³ or less. When the glass density is smaller, the weight of the glass substrate can be reduced more. Here, "density" denotes a value measured by a known Archimedes method. In order to lower the glass density, it may be advantageous to increase the content of $SiO_2$, $P_2O_5$, or $B_2O_3$, or to decrease the content of alkali metal oxides, alkaline earth metal oxides, ZnO, $ZrO_2$, or $TiO_2$.

The tempered glass substrate of the present invention has a glass thermal expansion coefficient in the temperature range of 30 to 380° C. of preferably 70 to 110×10⁻⁷/° C., more preferably 75 to 110×10⁻⁷/° C., still more preferably 80 to 110×10⁻⁷/° C., and particularly preferably 85 to 110×10⁻⁷/° C. When the thermal expansion coefficient of a glass is set within the above-mentioned range, the thermal expansion coefficient thereof tends to match those of members such as metals and organic adhesives, and peeling of members such as metals and organic adhesives can be prevented. Here, "thermal expansion coefficient" denotes a value measured in the temperature range of 30 to 380° C. using a dilatometer. In order to increase the thermal expansion coefficient, it may be advantageous to increase the content of alkali metal oxides or alkaline earth metal oxides, and, conversely, in order to decrease the thermal expansion coefficient, it may be advantageous to decrease the content of alkali metal oxides or alkaline earth metal oxides.

The tempered glass substrate of the present invention has a strain point of preferably 500° C. or higher, more preferably 510° C. or higher, 520° C. or higher, 540° C. or higher, or 550° C. or higher, and most preferably 560° C. or higher. When the strain point of a glass is higher, the heat resistance of the glass is more excellent, and even if a thermal treatment is performed on the tempered glass substrate, the tempered layer does not disappear easily. When the strain point of the glass is high, stress relaxation does not occur easily during ion exchange, thus, a high compression stress value can be obtained. In order to increase the strain point of a glass, it may be advantages to decrease the content of alkali metal oxides, or to increase the content of alkaline earth metal oxides, $Al_2O_3$, $ZrO_2$, or $P_2O_5$.

It is preferred that the tempered glass substrate of the present invention have a temperature corresponding to a glass high temperature viscosity of $10^{2.5}$ dPa·s of 1650° C. or lower, 1500° C. or lower, 1450° C. or lower, 1430° C. or lower, 1420° C. or lower, or 1400° C. or lower. The temperature corresponding to the glass high temperature viscosity of $10^{2.5}$ dPa·s corresponds to the glass melting temperature, and when the temperature corresponding to a glass high temperature viscosity of $10^{2.5}$ dPa·s is lower, the glass can be melted at lower temperature. Therefore, when the temperature corresponding to a glass high temperature viscosity of $10^{2.5}$ dPa·s is lower, burden on a glass production facility such as a melting furnace becomes smaller and the bubble quality of the glass substrate can be improved. Therefore, when the temperature corresponding to the glass high temperature viscosity of $10^{2.5}$ dPa·s is lower, the glass substrate can be produced at lower cost. In order to lower the temperature corresponding $10^{2.5}$ dPa·s, it may be advantages to increase the content of alkali metal oxides, alkaline earth metal oxides, ZnO, $B_2O_3$, or $TiO_2$, or to decrease the content of $SiO_2$ or $Al_2O_3$.

The tempered glass substrate of the present invention has a Young's modulus of 70 GPa or more, preferably 73 GPa or more, and more preferably 75 GPa or more. Therefore, in the case of using the tempered glass substrate as a cover glass of a display, when the Young's modulus is higher, the deformation amount when the surface of the cover glass is pushed by a pen or finger becomes smaller, and hence leading to reduction of damage caused to an internal display.

Further, the glass of the present invention is characterized by including, in terms of mass %, 40 to 71% of $SiO_2$, 3 to 21% of $Al_2O_3$, 0 to 3.5% of $Li_2O$, 7 to 20% of $Na_2O$, and 0 to 15% of $K_2O$, preferably characterized by including, in terms of mass %, 40 to 71% of $SiO_2$, 7.5 to 21% of $Al_2O_3$, 0 to 2% of $Li_2O$, 10 to 19% of $Na_2O$, 0 to 15% of $K_2O$, 0 to 6% of MgO, 0 to 6% of CaO, 0 to 3% of SrO, 0 to 3% of BaO, 0 to 8% of ZnO, and 0.01 to 3% of $SnO_2$, and more preferably characterized by including, in terms of mass %, 40 to 71% of $SiO_2$, 8.5 to 21% of $Al_2O_3$, 0 to 1% of $Li_2O$, 10 to 19% of $Na_2O$, 0 to 10% of $K_2O$, 0 to 6% of MgO, 0 to 6% of CaO, 0 to 3% of SrO, 0 to 3% of BaO, 0 to 8% of ZnO, 0.01 to 3% of $SnO_2$, and 0.001 to 10% of $ZrO_2$. The reason for limiting the glass composition to the above-mentioned range and the preferable range thereof in the glass of the present invention are the same as those for the tempered glass substrate described above, therefore, descriptions thereof are omitted here. Further, naturally, the glass of the present invention can have simultaneously the properties and effects of the tempered glass substrate described above.

In the glass of the present invention, because the constituent components are limited in the above-mentioned ranges, the ion exchange performance is excellent, and it is easy to set the surface compression stress to 600 MPa or more and set the depth of the compression stress layer to 10 μm or more.

The glass according to the present invention can be produced by placing a glass raw material which is prepared to have a glass composition within the above-mentioned composition range in a continuous melting furnace, melting the glass raw material by heating at 1500 to 1600° C., fining the resultant, feeding the resultant to a forming apparatus, and forming the molten glass into a plate shape, and gradually annealing the plate.

For forming the glass into a plate shape, it is preferable to adopt an overflow down draw method. When the glass substrate is formed by the overflow down draw method, a glass substrate which is not polished and has an excellent surface quality can be produced. The reason for this is as follows: in the case of adopting the overflow down draw method, the surfaces to be the surfaces of the glass substrate do not come in direct contact with a trough-shaped refractory, and is formed in the form of free surface, and hence, a glass substrate which is not polished and has excellent surface quality can be formed. Here, the overflow down draw method is a method in which a glass in molten condition is allowed to overflow from both sides of a heat-resistant trough-shaped structure, and the overflown molten glasses are draw-formed downwardly while combining them at the lower end of the trough-shaped structure, to thereby produce a glass substrate. The structure and material of the trough-shaped structure are not particularly limited as long as they provide desired size and surface precision of the glass substrate and can realize quality usable in the glass substrate. Further, any method may be used to apply force to the glass substrate to perform downward draw forming. For example, there may be adopted a method involving rotating a heat resistant roll having sufficiently large width in the state of being in contact with a glass substrate, to thereby draw the glass substrate, and a method involving allowing several pairs of heat resistant rolls to come into contact with only end surfaces of the glass substrate to thereby draw the glass substrate. The glass of the present invention is excellent in devitrification resistance and has a viscosity property suitable for forming, thus, forming by the overflow down draw method can be carried out with good precision by using the glass of the present invention. When the liquidus temperature is 1200° C. or lower and the liquidus viscosity is $10^{4.0}$ dPa·s or more, the glass substrate can be produced by an overflow down draw method.

Note that, in the present invention, a method other than the overflow down draw method can be adopted when high surface quality is not required. For example, various forming methods can be adopted, such as down draw methods (a slot down method and a re-draw method), a float method, a roll out method, and a press method. For example, if a glass is formed by a press method, a small-sized glass substrate can be produced with good efficiency.

For producing the tempered glass substrate of the present invention, first, the above-mentioned glass is prepared. Next, a tempering treatment is performed. The glass substrate may be cut into a given size before the tempering treatment, however, it is preferable to perform the cutting after the tempering treatment, because the production cost can be reduced. It is desirable that the tempering treatment is performed by an ion exchange treatment. The ion exchange treatment can be performed, for example, by immersing a glass plate in a potassium nitrate solution at 400 to 550° C. for 1 to 8 hours. Optimum ion exchange conditions may be selected in view of glass viscosity property, application, plate thickness, tensile stress in glass, and the like.

EXAMPLE 1

The present invention is described based on examples below.

Tables 1 to 4 show glass compositions and properties of examples of the present invention (sample Nos. 1 to 26). Note that, in the tables, expression "none" means "not measured".

TABLE 1

|  | No. 1 | No. 2 | No. 3 | No. 4 | No. 5 | No. 6 | No. 7 | No. 8 |
|---|---|---|---|---|---|---|---|---|
| $SiO_2$ | 51.9 | 52.9 | 54.4 | 52.9 | 60.9 | 62.4 | 60.4 | 54.4 |
| $Al_2O_3$ | 19.0 | 19.0 | 16.0 | 16.0 | 16.0 | 13.0 | 13.0 | 13.0 |
| $Na_2O$ | 16.0 | 16.0 | 16.0 | 16.0 | 16.0 | 16.0 | 16.0 | 16.0 |
| $Li_2O$ | — | — | — | — | — | — | — | — |
| $K_2O$ | 2.0 | 2.0 | 2.0 | 2.0 | 2.0 | 2.0 | 2.0 | 2.0 |
| $ZrO_2$ | 5.0 | 2.5 | 5.0 | 2.5 | — | 2.5 | — | 5.0 |
| $TiO_2$ | — | 2.5 | 2.5 | 4.5 | — | — | 2.5 | 4.5 |
| $B_2O_3$ | 2.0 | 2.0 | 2.0 | 2.0 | 2.0 | 2.0 | 2.0 | 2.0 |
| MgO | 2.0 | 1.0 | — | 2.0 | 1.0 | — | 2.0 | 1.0 |
| CaO | 2.0 | 2.0 | 2.0 | 2.0 | 2.0 | 2.0 | 2.0 | 2.0 |
| $SnO_2$ | 0.1 | 0.1 | 0.1 | 0.1 | 0.1 | 0.1 | 0.1 | 0.1 |
| Density (g/cm$^3$) | 2.56 | 2.53 | 2.57 | 2.56 | 2.47 | 2.50 | 2.49 | 2.59 |
| Ps (° C.) | 575 | 558 | 562 | 550 | 520 | 523 | 519 | 552 |
| Ta (° C.) | 622 | 600 | 604 | 588 | 561 | 564 | 557 | 591 |
| Ts (° C.) | 841 | 806 | 805 | 775 | 761 | 762 | 741 | 775.5 |
| $10^4$ (° C.) | 1171 | 1152 | 1153 | 1088 | 1138 | 1135 | 1083 | 1091 |
| $10^3$ (° C.) | 1335 | 1334 | 1333 | 1259 | 1349 | 1340 | 1277 | 1260 |
| $10^{2.5}$ (° C.) | 1444 | 1452 | 1451 | 1375 | 1484 | 1472 | 1406 | 1372 |
| Young's modulus (GPa) | none | None | none | none | none | none | none | none |
| $\alpha$ ($\times 10^{-7}$/° C.) | 94 | 96 | 94 | 96 | 95 | 92 | 96 | 96 |
| TL (° C.) | none | 1005 | <900 | 930 | <900 | <900 | <900 | <900 |
| log$\eta$ TL | none | 5.1 | >6.2 | 5.4 | >5.8 | >5.8 | >5.5 | >5.8 |
| Compression stress value (MPa) | 1462 | 1366 | 1338 | 1348 | 909 | 842 | 943 | 1322 |
| Stress layer depth ($\mu$m) | 18 | 20 | 17 | 16 | 23 | 23 | 18 | 15 |
| Internal tensile stress (MPa) | 28 | 28 | 24 | 22 | 22 | 20 | 18 | 21 |

TABLE 2

|  | No. 9 | No. 10 | No. 11 | No. 12 | No. 13 | No. 14 | No. 15 |
|---|---|---|---|---|---|---|---|
| $SiO_2$ | 52.4 | 50.4 | 53.9 | 53.9 | 61.4 | 59.4 | 56.9 |
| $Al_2O_3$ | 16.0 | 16.0 | 16.0 | 14.5 | 13.0 | 13.0 | 13.0 |
| $Na_2O$ | 16.0 | 16.0 | 16.0 | 16.0 | 11.0 | 7.0 | 15.0 |
| $Li_2O$ | — | — | — | — | — | — | — |
| $K_2O$ | 2.0 | 2.0 | 2.0 | 2.0 | 6.0 | 10.5 | 5.0 |
| $ZrO_2$ | 5.0 | 5.0 | 5.0 | 6.5 | 2.5 | 4.0 | 4.0 |
| $TiO_2$ | 2.5 | 4.5 | — | — | — | — | — |
| $B_2O_3$ | 2.0 | 2.0 | 2.0 | 2.0 | 2.0 | 2.0 | 2.0 |
| MgO | 2.0 | 2.0 | 2.0 | 2.0 | 2.0 | 2.0 | 2.0 |
| CaO | 2.0 | 2.0 | 3.0 | 3.0 | 2.0 | 2.0 | 2.0 |
| $SnO_2$ | 0.1 | 0.1 | 0.1 | 0.1 | 0.1 | 0.1 | 0.1 |
| Density (g/cm$^3$) | 2.57 | 2.59 | 2.55 | 2.57 | 2.47 | 2.49 | 2.53 |
| Ps (° C.) | 563 | 563 | 557 | 562 | 544 | 574 | 529 |
| Ta (° C.) | 605 | 603 | 601 | 606 | 589 | 623 | 570 |
| Ts (° C.) | 805 | 792 | 808 | 812 | 812 | 867 | 773 |
| $10^4$ (° C.) | 1123 | 1097 | 1137 | 1130 | 1205 | 1253 | 1122 |
| $10^3$ (° C.) | 1289 | 1258 | 1303 | 1291 | 1406 | 1447 | 1300 |
| $10^{2.5}$ (° C.) | 1397 | 1363 | 1410 | 1397 | 1534 | 1570 | 1417 |
| Young's modulus (GPa) | none | none | none | none | none | none | none |
| $\alpha$ ($\times 10^{-7}$/° C.) | 95 | 95 | 95 | 94 | 90 | 88 | 100 |
| TL (° C.) | none | none | none | none | 945 | 1075 | 855 |
| log$\eta$ TL | none | none | none | none | 6.0 | 5.3 | 6.4 |
| Compression stress value (MPa) | 1293 | 1407 | 1226 | 1274 | 858 | 623 | 1020 |
| Stress layer depth ($\mu$m) | 23 | 21 | 23 | 14 | 25 | 36 | 24 |
| Internal tensile stress (MPa) | 32 | 30 | 29 | 18 | 23 | 24 | 26 |

TABLE 3

| | No. 16 | No. 17 | No. 18 | No. 19 | No. 20 | No. 21 | No. 22 | No. 23 |
|---|---|---|---|---|---|---|---|---|
| $SiO_2$ | 55.9 | 55.9 | 55.9 | 57.9 | 55.9 | 55.9 | 55.9 | 58.4 |
| $Al_2O_3$ | 13.0 | 13.0 | 13.0 | 13.0 | 13.0 | 13.0 | 13.0 | 13.0 |
| $Na_2O$ | 15.0 | 12.5 | 11.5 | 12.0 | 15.0 | 16.0 | 15.0 | 13.0 |
| $Li_2O$ | — | — | — | — | — | — | — | — |
| $K_2O$ | 5.0 | 4.0 | 5.0 | 4.0 | 5.0 | 4.0 | 3.5 | 3.5 |
| $ZrO_2$ | 5.0 | 5.0 | 5.0 | 5.0 | 5.0 | 5.0 | 5.0 | 5.0 |
| $TiO_2$ | — | — | — | — | — | — | 1.5 | 3.0 |
| $B_2O_3$ | 2.0 | 2.5 | 2.5 | — | 2.0 | 2.0 | 2.0 | — |
| MgO | 2.0 | 4.0 | 3.0 | 4.0 | 3.0 | 3.0 | 3.0 | 3.0 |
| CaO | 2.0 | 3.0 | 4.0 | 4.0 | 1.0 | 1.0 | 1.0 | 1.0 |
| $SnO_2$ | 0.1 | 0.1 | 0.1 | 0.1 | 0.1 | 0.1 | 0.1 | 0.1 |
| Cl (ppm) | 50 | 50 | — | 100 | 100 | 150 | 100 | 150 |
| $SO_3$ (ppm) | — | 10 | 20 | — | — | — | 10 | — |
| Density (g/cm³) | 2.55 | 2.56 | 2.56 | 2.57 | 2.55 | 2.55 | 2.55 | 2.55 |
| Ps (° C.) | 533 | 558 | 558 | 589 | 538 | 536 | 551 | 591 |
| Ta (° C.) | 574 | 602 | 601 | 634 | 580 | 578 | 593 | 637 |
| Ts (° C.) | 780 | 809 | 811 | 847 | 791 | 785 | 800 | 855 |
| $10^4$ (° C.) | 1130 | 1141 | 1145 | 1168 | 1142 | 1133 | 1139 | 1195 |
| $10^3$ (° C.) | 1305 | 1308 | 1314 | 1335 | 1317 | 1307 | 1312 | 1372 |
| $10^{2.5}$ (° C.) | 1418 | 1417 | 1424 | 1443 | 1430 | 1420 | 1424 | 1486 |
| Young's modulus (GPa) | none | none | none | none | none | none | none | none |
| $\alpha$ ($\times 10^{-7}$/° C.) | 100 | 89 | 90 | 89 | 99 | 100 | 95 | 88 |
| TL (° C.) | 875 | none | none | none | 895 | 895 | 905 | none |
| log$\eta$ TL | 6.3 | none | none | none | 6.2 | 6.1 | 6.1 | none |
| Compression stress value (MPa) | 949 | 1087 | 993 | 1079 | 1048 | 1052 | 1186 | 1245 |
| Stress layer depth (μm) | 35 | 20 | 23 | 23 | 37 | 35 | 30 | 32 |
| Internal tensile stress (MPa) | 36 | 23 | 24 | 26 | 42 | 40 | 38 | 43 |

TABLE 4

| | No. 24 | No. 25 | No. 26 |
|---|---|---|---|
| $SiO_2$ | 69.9 | 70.6 | 57.3 |
| $Al_2O_3$ | 13.4 | 13.5 | 13.0 |
| $Na_2O$ | 8.2 | 8.3 | 14.5 |
| $Li_2O$ | 1.9 | 1.9 | — |
| $K_2O$ | 5.4 | 5.4 | 4.9 |
| $ZrO_2$ | — | — | 4.0 |
| $TiO_2$ | — | — | — |
| $B_2O_3$ | — | — | 2.0 |
| MgO | — | — | 2.0 |
| CaO | — | — | 2.0 |
| $SnO_2$ | 1.2 | 0.3 | 0.3 |
| Density (g/cm³) | 2.41 | 2.39 | 2.54 |
| Ps (° C.) | 473 | 467 | 523 |
| Ta (° C.) | 521 | 514 | 563 |
| Ts (° C.) | 765 | 756 | 762 |
| $10^4$ (° C.) | 1210 | 1205 | 1100 |
| $10^3$ (° C.) | 1453 | 1454 | 1280 |
| $10^{2.5}$ (° C.) | 1609 | 1612 | 1396 |
| Young's modulus (GPa) | 74 | 73 | 75 |
| $\alpha$ ($\times 10^{-7}$/° C.) | 83 | 84 | 100 |
| TL (° C.) | 900 | 910 | 855 |
| log$\eta$ TL | 6.1 | 5.9 | 6.2 |
| Compression stress value (MPa) | 550 | 500 | 1,020 |
| Stress layer depth (μm) | 28 | 29 | 25 |
| Internal tensile stress (MPa) | 16 | 15 | 27 |

Each of the samples in Tables 1 to 4 were produced as described below. First, a glass raw material was prepared so as to have a glass composition shown in the table, and the raw material was melted at 1580° C. for 8 hours using a platinum pot. Thereafter, the molten glass was cast on a carbon plate and formed into a plate shape. Various properties were evaluated for the resultant glass plate.

The density was measured by a known Archimedes method.

The strain point Ps and the slow annealing point Ta were measured based on a method of ASTM C336.

The softening point Ts was measured based on a method of ASTM C338.

Temperatures corresponding to glass viscosities $10^{4.0}$ dPa·s, $10^{3.0}$ dPa·s, and $10^{2.5}$ dPa·s were measured by a platinum sphere lifting method.

The Young's modulus was measured by a bending resonance method.

As the thermal expansion coefficient $\alpha$, an average thermal expansion coefficient in the temperature range of 30 to 380° C. was measured using a dilatometer.

As for the liquidus temperature TL: a glass was ground, and a glass powder which passes through a standard sieve of 30 mesh (mesh opening 500 μm) and remaining on 50 mesh (mesh opening 300 μm) was placed in a platinum boat, kept in a temperature gradient furnace for 24 hours, then, the crystal thereof deposited, and the temperature at this stage was referred to as liquidus temperature.

The liquidus viscosity log$\eta$ TL shows the viscosity of each glass at the liquidus temperature.

As a result, the obtained glass substrate had a density of 2.59 g/cm³ or less, a thermal expansion coefficient of 83 to $100 \times 10^{-7}$/° C., thus, the glass substrate was suitable as a tempered glass substrate. The liquidus viscosity was as high as $10^{5.1}$ dPa·s or more and overflow down draw forming is possible, further, the temperature at $10^{2.5}$ dPa·s was as low as 1612° C. or lower, thus, it is supposed that a large amount of glass substrates can be fed at low cost with high productivity. Note that the untempered glass substrate and tempered glass substrate are not substantially different in glass composition as the whole glass substrate, even though the glass compositions thereof are microscopically different on the surface of the glass substrate. Therefore, for property values such as density and viscosity, the untempered glass substrate and tempered glass substrate are not substantially different. Subsequently, both surfaces of each of the glass substrates of sample Nos. 1 to 26 were subjected to optical polishing, then, an ion exchange treatment was performed. Sample Nos. 1 to 8, 13 to 15, 24, and 25 were immersed in a KNO$_3$ melted salt at 430° C. for 4 hours, and sample Nos. 9 to 12, 16 to 23, and 26 were immersed in a KNO$_3$ melted salt at 460° C. for 4 hours. After completion of the treatment, the surface of each sample was washed, then, compression stress value and stress layer depth (depth of compression stress layer) were calculated from the number of interference stripes and clearance thereof observed using a surface stress meter (FSM-6000 manufactured by Toshiba Corporation). In calculation, the refractive index of a sample was 1.53, and the photoelastic constant was 28[(nm/cm)/MPa].

As a result, in the glass substrates of sample Nos. 1 to 26 which are examples of the present invention, compression stress of 500 MPa or more was generated on its surface, and its depth was as deep as 14 μm or more. The internal tensile stress in the substrate having a plate thickness of 1 mm was as low as 43 MPa or less.

Glass test pieces having different internal stresses were produced by using the glass sample of sample No. 15, which is an example of the present invention, and by changing the thickness of the glass substrate and the ion exchange conditions, to thereby evaluate the condition of breakage by internal stress.

The evaluation method is as described below.

From the glass of sample No. 15, a glass plate having a plate thickness of 0.5 mm and a glass plate having a plate thickness of 0.7 mm were produced, and were each cut into a size of 35 mm×35 mm. On each of the thus obtained glass substrates, ion exchange was carried out under conditions of 460° C. for 6 hours, 460° C. for 8 hours, and 490° C. for 6 hours, then, compression stress was measured. The results thereof are shown in Table 5. Note that the compression stress was measured by the same method as described above, and the internal stress (internal tensile stress in glass substrate) was calculated according to the above-mentioned formula from the compression stress value.

TABLE 5

| Ion exchange condition | Compression stress value (MPa) | Depth of compression stress layer (μm) | Internal stress (MPa) 0.7 mm thick | Internal stress (MPa) 0.5 mm thick |
|---|---|---|---|---|
| 460° C. for 6 hours | 540 | 55 | 50 | 76 |
| 460° C. for 6 hours | 537 | 58 | 53 | 81 |
| 490° C. for 6 hours | 429 | 76 | 59 | 94 |

For the glass substrates in Table 5, to check whether the glass substrate is broken or not when a flaw is formed on its surface and the flaw reaches to the internal stress layer, the following procedure was conducted: a scribe machine in which a wheel tip material is diamond was used, the air pressure was set to 0.3 MPa, the wheel tip blade angle was set to 125°, the wheel tip polishing grade was set to D521, and a wheel tip was allowed to hit the surface of the glass substrate to break the glass substrate.

Table 6 shows the number of broken pieces after breakage of the glass substrate. For reference, the number of broken pieces of the glass substrate which did not undergo ion exchange and has an internal stress of 0 is also shown. As is apparent from Table 6, it is understood that when the internal stress is 50 to 94 MPa, the number of broken pieces is about the same as that of the glass substrate having an internal stress of 0.

TABLE 6

| Internal stress | Number of broken pieces |
|---|---|
| 0 | 2 |
| 50 | 2 |
| 53 | 2 |
| 59 | 3 |
| 64 | 3 |
| 76 | 3 |
| 81 | 3 |
| 94 | 3 |

Note that, in the above-mentioned examples, a glass was melted, formed by casting, and then optically polished before the ion exchange treatment, for convenience of explanation of the present invention. In the case of production in industrial scale, it is preferred that a glass substrate be manufactured by an overflow down draw method and the like, and an ion exchange treatment be carried out in the state that the both surfaces of the glass substrate are unpolished.

INDUSTRIAL APPLICABILITY

The tempered glass substrate of the present invention is suitable as a cover glass or a touch panel display substrate for cellular phones, digital cameras, PDA, and solar batteries. The tempered glass substrate of the present invention is expected to be applied to applications requiring high mechanical strength, for example, window glasses, magnetic disk substrates, flat panel display substrates, solid-state imaging device cover glasses, and tableware, in addition to the above-mentioned applications.

The invention claimed is:

1. A tempered glass substrate, which has a compression stress layer on a surface thereof, and has a glass composition comprising, in terms of mass %, 58.4 to 71% of SiO$_2$, 3 to 23% of Al$_2$O$_3$, 0 to 1% of Li$_2$O, 8.2 to 20% of Na$_2$O, 0 to 2% of K$_2$O, 0.5% or less of TiO$_2$, and 0 to 4% of MgO+CaO+SrO+BaO, wherein the compression stress layer has a compression stress value of 600 MPa or more, and wherein the tempered glass substrate has an unpolished surface having an average surface roughness Ra of 5 Å or less.

2. The tempered glass substrate according to claim 1, which has a compression stress layer on a surface thereof, and has a glass composition comprising, in terms of mass %, 58.4 to 71% of SiO$_2$, 12 to 23% of Al$_2$O$_3$, 0 to 1% of Li$_2$O, 10 to 19% of Na$_2$O, and 0 to 2% of K$_2$O, and further comprising 0 to 4% of CaO, 0 to 3% of SrO, 0 to 3% of BaO, and 0 to 8% of ZnO.

3. The tempered glass substrate according to claim 2, wherein the tempered glass substrate further comprises 0.01 to 3% of SnO$_2$.

4. The tempered glass substrate according to claim 1, wherein the glass composition further comprises, in terms of mass %, less than 0.01% of As$_2$O$_3$ and less than 0.01% of Sb$_2$O$_3$.

5. The tempered glass substrate according to claim 4, wherein the tempered glass substrate further comprises 0.01 to 3% of SnO$_2$.

6. The tempered glass substrate according to claim 1, wherein the tempered glass substrate further comprises 0.01 to 3% of SnO$_2$.

7. The tempered glass substrate according to claim 1, wherein the tempered glass substrate further comprises 0.001 to 10% of $ZrO_2$.

8. The tempered glass substrate according to claim 1, which is formed by being chemically tempered.

9. The tempered glass substrate according to claim 1, wherein the compression stress layer has a compression stress value of 600 MPa or more, a depth of the compression stress layer is 10 μm or more, and an internal tensile stress in the tempered glass substrate is 200 MPa or less.

10. The tempered glass substrate according to claim 1, wherein the tempered glass substrate comprises a glass composition having a liquidus temperature of 1200° C. or lower.

11. The tempered glass substrate according to claim 1, wherein the tempered glass substrate comprises a glass composition having a liquidus viscosity of $10^{4.0}$ dPa·s or more.

12. The tempered glass substrate according to claim 1, which is used as a cover glass of a display.

13. The tempered glass substrate according to claim 1, which is used as a cover glass of a solar battery.

14. The tempered glass substrate according to claim 1, wherein the tempered glass substrate comprises a glass composition having a liquidus viscosity of $10^{5.0}$ dPa·s or more.

15. The tempered glass substrate according to claim 1, wherein a depth of the compression stress layer is 10 to 37 μm.

16. The tempered glass substrate according to claim 1, wherein the compression stress layer has a compression stress value of 800 MPa or more.

17. The tempered glass substrate according to claim 1, wherein the glass composition is substantially free of CaO.

18. A method of producing a tempered glass substrate, comprising:

melting a glass raw material which is prepared to have a glass composition comprising, in terms of mass %, 58.4 to 71% of $SiO_2$, 3 to 23% of $Al_2O_3$, 0 to 1% of $Li_2O$, 8.2 to 20% of $Na_2O$, 0 to 2% of $K_2O$, 0.5% or less of $TiO_2$, and 0 to 4% of MgO+CaO+SrO+BaO, to form a resultant;

forming the resultant into a plate shape; and performing an ion exchange treatment on the plate shape to form a compression stress layer on a surface of the glass, wherein the compression stress layer has a compression stress value of 600 MPa or more, to produce the tempered glass substrate having an unpolished surface having an average surface roughness Ra of 5 Å or less.

19. The method of producing the tempered glass substrate according to claim 18, wherein the forming the resultant into the plate shape is performed by a down draw method.

20. The method of producing the tempered glass substrate according to claim 18, wherein the forming the resultant into the plate shape is performed by an overflow down draw method.

* * * * *